United States Patent
Chu et al.

(10) Patent No.: US 10,079,583 B2
(45) Date of Patent: Sep. 18, 2018

(54) TRANSMITTER POWER DETECTION CIRCUIT AND METHOD

(71) Applicant: TAIWAN SEMICONDUCTOR MANUFACTURING COMPANY, LTD., Hsinchu (TW)

(72) Inventors: Hong-Lin Chu, Hsinchu (TW); Hsieh-Hung Hsieh, Taipei (TW); Tzu-Jin Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/682,918

(22) Filed: Aug. 22, 2017

(65) Prior Publication Data
US 2018/0152161 A1 May 31, 2018

Related U.S. Application Data (60) Provisional application No. 62/427,592, filed on Nov. 29, 2016.

(51) Int. Cl.
H03C 1/62 (2006.01)
H04B 17/00 (2015.01)
(Continued)

(52) U.S. Cl.
CPC ....... *H03G 3/3042* (2013.01); *G01R 31/3606* (2013.01); *H01M 10/48* (2013.01);
(Continued)

(58) Field of Classification Search
CPC .... H03G 3/3042; G01R 31/3606; H03F 3/24; H04B 1/0466; H04B 2001/0416
See application file for complete search history.

(56) References Cited

U.S. PATENT DOCUMENTS 6,084,920 A * 7/2000 Ferdinandsen ...... H03G 3/3042
330/140
8,279,008 B2 10/2012 Hsieh et al.
(Continued)

OTHER PUBLICATIONS

Shih et al., "A Highly-Integrated 3-8 GHz Ultra-Wideband Rf Transmitter With Digita-Assisted Carrier Leakage calibration and Automatic Transmit Power Control", IEEE Transactions on Very Large Scale Integration (Vlsi) Systems, vol. 20, No. 8, Aug. 2012, pp. 1357-1367.
(Continued)

*Primary Examiner* — Nguyen Vo
(74) *Attorney, Agent, or Firm* — Hauptman Ham, LLP (57) ABSTRACT

A circuit includes a first device between a first input node and an internal node, a second device between a second input node and the internal node, a third device between the internal node and ground, a fourth device between the internal node and an output node, and a fifth device between the output node and ground. The second and third devices generate a direct current (DC) voltage on the internal node by dividing a bias voltage on the second input node. The fourth device generates, from the DC voltage, a first component of an output voltage on the output node. The first and third devices generate a modulation signal on the internal node by dividing a radio frequency (RF) signal on the first input node. The fifth device rectifies the modulation signal to generate a second output voltage component.

20 Claims, 9 Drawing Sheets

(51) Int. Cl.
*H03G 3/30* (2006.01)
*H03F 3/24* (2006.01)
*H01M 10/48* (2006.01)
*H04B 1/04* (2006.01)
*G01R 31/36* (2006.01)

(52) U.S. Cl.
CPC ............ *H03F 3/24* (2013.01); *H04B 1/0466* (2013.01); *H04B 2001/0416* (2013.01)

(56) References Cited

U.S. PATENT DOCUMENTS

| | | |
|---|---|---|
| 8,427,240 B2 | 4/2013 | Hsieh et al. |
| 8,593,206 B2 | 11/2013 | Chen et al. |
| 8,610,494 B1 | 12/2013 | Jin et al. |
| 8,618,631 B2 | 12/2013 | Jin et al. |
| 8,912,581 B2 | 12/2014 | Lin et al. |
| 8,941,212 B2 | 1/2015 | Yen et al. |
| 9,184,256 B2 | 11/2015 | Huang et al. |
| 9,209,521 B2 | 12/2015 | Hung et al. |
| 2007/0030064 A1* | 2/2007 | Yu .................. G01R 21/10 330/140 |
| 2014/0132333 A1 | 5/2014 | Jin et al. |
| 2014/0253262 A1 | 9/2014 | Hsieh et al. |
| 2014/0253391 A1 | 9/2014 | Yen |
| 2015/0042405 A1* | 2/2015 | Kim .................. H03G 3/3042 330/279 |
| 2015/0364417 A1 | 12/2015 | Lee |

OTHER PUBLICATIONS

Mang et al., "On-line Calibration and Power Optimization of Rf Systems using a Built-in Detector", 2009 27th IEEE Vlsi Test Symposium, pp. 285-290.

\* cited by examiner

TRANSMITTER POWER DETECTION CIRCUIT AND METHOD

BACKGROUND

Radio frequency (RF) transmitters often are designed to meet industry standards that facilitate desired communications and avoid undesired interference by maintaining compatibility with other devices. To ensure such compatibility, industry standards typically include provisions directed to transmitter power levels.

In some RF transmitter circuit applications, an output stage includes a power amplifier that is part of an integrated circuit (IC) chip. Transmitter components can include additional IC circuits as well as components such as antennae located externally to the IC chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a transmitter circuit includes an amplifier that outputs an RF signal on an output node, a power detection circuit coupled with the output node, a reference voltage generator, a comparator that receives an output voltage of the power detection circuit and a reference voltage of the reference voltage generator, and an ADC coupled between the comparator and the amplifier. The power detection circuit generates the output voltage having a first component based on a DC bias voltage and a second component based on a power level of the RF signal. The reference voltage generator generates the reference voltage based on the DC bias voltage, and the amplifier adjusts the power level of the RF signal responsive to an output of the ADC.

Figure 1:
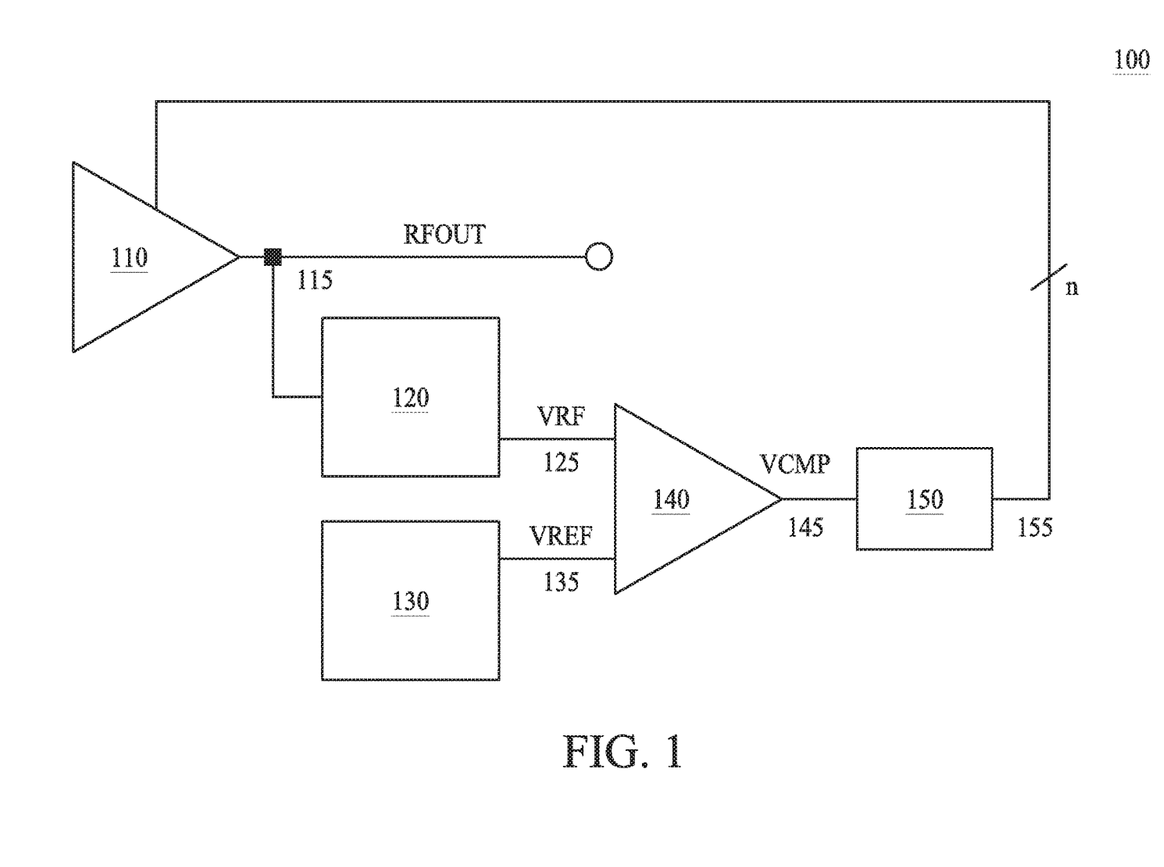
FIG. 1 is a diagram of a transmitter circuit, in accordance with some embodiments.

FIG. 1 is a diagram of a transmitter circuit 100, in accordance with some embodiments. Transmitter circuit 100 includes an amplifier 110, a power detection circuit 120, a reference voltage generator 130, a comparator 140, and an analog-to-digital converter (ADC) 150. Amplifier 110 is electrically coupled to power detection circuit 120 by a node 115, power detection circuit 120 is electrically coupled to comparator 140 by a node 125, reference voltage generator 130 is electrically coupled to comparator 140 by a node 135, comparator 140 is electrically coupled to ADC 150 by a node 145, and ADC 150 is electrically coupled to amplifier 110 by a signal path 155.

In some embodiments, transmitter circuit 100 is a component of an RF transmitter. In some embodiments, transmitter circuit 100 is a component of an RF transmitter having an operating frequency from 2.2 gigahertz (GHz) to 2.6 GHz. In some embodiments, transmitter circuit 100 is a component of an RF transmitter having an operating frequency from 5.6 GHz to 6.0 GHz.

In some embodiments, transmitter circuit 100 is a component of an RF transmitter conforming to a wireless network standard. In some embodiments, transmitter circuit 100 is a component of an RF transmitter conforming to a Bluetooth standard.

Amplifier 110 is an RF power amplifier configured to receive one or more input signals (not shown) on one or more input terminals (not shown) and output a signal RFOUT on node 115. Amplifier 110 is configured to generate signal RFOUT by increasing an amplitude of the one or more input signals by a gain having a gain level, and to adjust the gain level in response to a plurality of bits n received on signal path 155.

In some embodiments, amplifier 110 is configured to generate signal RFOUT by increasing the amplitude of an input signal relative to a ground or other reference level. In some embodiments, amplifier 110 is configured to generate signal RFOUT by increasing the amplitude of a differential input signal.

By adjusting the gain level in response to plurality of bits n, amplifier 110 is capable of outputting signal RFOUT having a predetermined power level controlled by plurality of bits n. In some embodiments, plurality of bits n ranges from a lowest value to a highest value, and amplifier 110 is configured to adjust the gain level inversely to the value of plurality of bits n. In some embodiments, plurality of bits n ranges from a lowest value to a highest value, and amplifier 110 is configured to adjust the gain level proportionally to the value of plurality of bits n.

In some embodiments, amplifier 110 is configured to respond to plurality of bits n on signal path 155 having a number ranging from 4 bits to 6 bits. In some embodiments, amplifier 110 is configured to respond to plurality of bits n on signal path 155 having fewer than 4 bits. In some embodiments, amplifier 110 is configured to respond to plurality of bits n on signal path 155 having greater than 6 bits.

In some embodiments, amplifier 110 is configured to respond to plurality of bits n received in series. In some embodiments, signal path 155 includes more than one conductive path, and amplifier 110 is configured to respond to plurality of bits n received in parallel.

Power detection circuit 120 is configured to receive signal RFOUT on node 115 and to output a voltage VRF on node 125. Power detection circuit 120 is configured to generate voltage VRF having a direct current (DC) voltage level that includes a first component summed with a second component. In some embodiments, voltage VRF includes one or more alternating current (AC) or other time-varying components that are small relative to the first and second components of the DC voltage level.

The first component of the DC voltage level corresponds to a predetermined voltage level, and the second component of the DC voltage level varies based on an amplitude of signal RFOUT.

In some embodiments, power detection circuit 120 is configured to generate the second component of the DC voltage level having a magnitude that increases with respect to an increasing amplitude, or power level, of signal RFOUT. In some embodiments, power detection circuit 120 is configured to generate the second component of the DC voltage level having a magnitude that decreases with respect to an increasing amplitude, or power level, of signal RFOUT.

Reference voltage generator 130 is configured to generate a reference voltage VREF and output reference voltage VREF on node 135. Reference voltage generator 130 is configured to generate reference voltage VREF having a DC voltage level corresponding to the first component of the DC voltage level of voltage VRF.

In some embodiments, reference voltage generator 130 is configured to generate reference voltage VREF having a DC voltage level equal to the first component of the DC voltage level of voltage VRF. In some embodiments, reference voltage generator 130 is configured to generate reference voltage VREF having a DC voltage level equal to the first component of the DC voltage level of voltage VRF plus or minus an offset value. In some embodiments, reference voltage generator 130 is configured to generate reference voltage VREF having a DC voltage level proportional to the first component of the DC voltage level of voltage VRF.

Comparator 140 is configured to receive voltage VRF on node 125, receive reference voltage VREF on node 135, generate a voltage VCMP based on a difference between voltage VRF and reference voltage VREF, and output voltage VCMP on node 145. In some embodiments, comparator 140 is configured to generate voltage VCMP equal to a difference between voltage VRF and reference voltage VREF.

Because reference voltage VREF corresponds to the first component of the DC level of voltage VRF, and voltage VCMP is based on the difference between voltage VRF and reference voltage VREF, voltage VCMP has a magnitude that varies based on the second component of the DC level of voltage VRF, and therefore based on the amplitude, or power level, of signal RFOUT.

ADC 150 is configured to receive voltage VCMP on node 145 and generate plurality of bits n on signal path 155 based on voltage VCMP. In some embodiments, ADC 150 is configured to generate plurality of bits n ranging from a lowest value to a highest value, with the value varying proportionally to a value of voltage VCMP. In some embodiments, ADC 150 is configured to generate plurality of bits n ranging from a lowest value to a highest value, with the value varying inversely to a value of voltage VCMP. In some embodiments, ADC 150 is a successive approximation register (SAR) ADC.

In some embodiments, ADC 150 is configured to generate plurality of bits n on signal path 155 having a number ranging from 4 bits to 6 bits. In some embodiments, ADC 150 is configured to generate plurality of bits n on signal path 155 having fewer than 4 bits. In some embodiments, ADC 150 is configured to generate plurality of bits n on signal path 155 having greater than 6 bits.

In some embodiments, ADC 150 is configured to generate plurality of bits n on signal path 155 in series. In some embodiments in which signal path 155 includes more than one conductive path, ADC 150 is configured to generate plurality of bits n on signal path 155 in parallel.

In operation, plurality of bits n, based on voltage VCMP, provide feedback to amplifier 110 such that adjustments to the gain level of amplifier 110 maintain a predetermined power level of signal RFOUT. In some embodiments, in operation, amplifier 110 increases the gain level in response to plurality of bits n having one or more first values and decreases the gain level in response to plurality of bits n having one or more second values different from the one or more first values. In some embodiments, in operation, amplifier 110 adjusts the gain level in response to plurality of bits n having one or more first values and maintains a previous gain level in response to plurality of bits n having one or more second values different from the one or more first values.

In some embodiments, in operation, amplifier 110 sets the gain level to a level of a plurality of levels, each level corresponding to a value of a plurality of values of plurality of bits n.

By this configuration, transmitter circuit 100 is capable of compensating for process and temperature variations in an output power of amplifier 110. The comparator-based architecture of transmitter circuit 100 enables process and temperature variation compensation with lower power and smaller area requirements compared to other approaches for making amplifier gain adjustments.

In some embodiments, amplifier 110, power detection circuit 120, reference voltage generator 130, comparator 140, and ADC 150 are components of a single IC chip, and transmitter circuit 100 uses fewer off-chip components and less space than are required using other approaches for making amplifier gain adjustments.

Figure 2:
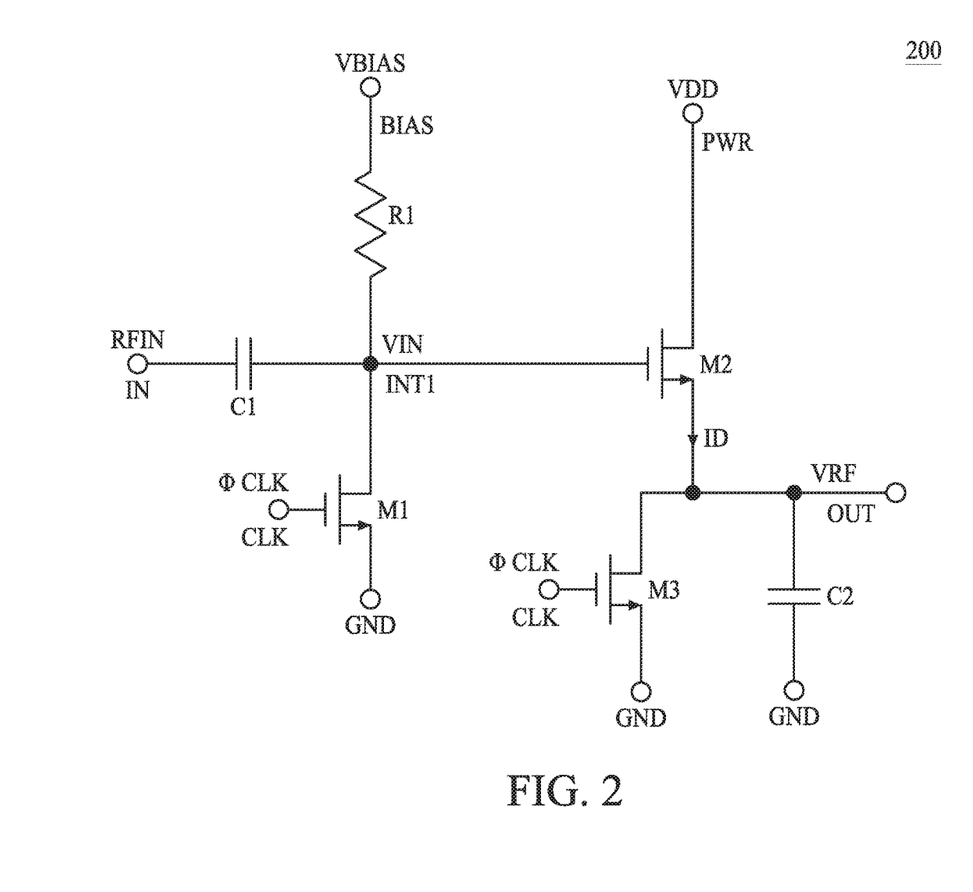
FIG. 2 is a diagram of a power detection circuit, in accordance with some embodiments.

FIG. 2 is a diagram of a power detection circuit 200, in accordance with some embodiments. Power detection circuit 200 is usable as power detection circuit 120, described above with respect to transmitter circuit 100 and FIG. 1. Power detection circuit 200 includes devices C1, R1, M1, M2, M3, and C2. Power detection circuit 200 also includes an input node IN configured to receive an RF signal RFIN, and an output node OUT. In some embodiments, RF signal RFIN is RF signal RFOUT, input node IN is node 115, and output node OUT is node 125, each described above with respect to transmitter circuit 100 and FIG. 1.

Device C1 is coupled between input node IN and an internal node INT1. Device R1 is coupled between an input node BIAS and internal node INT1. Device M1 is coupled between internal node INT1, a signal node CLK, and a ground node GND. Device M2 is coupled between internal node INT1, a power node PWR, and output node OUT. Device M3 is coupled between output node OUT, signal node CLK, and ground node GND. Device C2 is coupled between output node OUT and ground node GND.

Power detection circuit 200 is configured to switch between a first mode of operation and a second mode of operation responsive to a signal φCLK on signal node CLK, as described below.

Device C1 is a circuit component configured to receive RF signal RFIN on input node IN and transfer at least a portion of RF signal RFIN to internal node INT1 by capacitively coupling input node IN to internal node INT1.

In the embodiment depicted in FIG. 2, device C1 is a capacitive element. In some embodiments, device C1 is a capacitor. In some embodiments, device C1 is a transistor or other suitable device configured to transfer at least a portion of RF signal RFIN from input node IN to internal node INT1.

Device R1 is a circuit component configured to transfer at least a portion of a DC voltage VBIAS from input BIAS to internal node INT1 by resistively coupling input node BIAS to internal node INT1. In the embodiment depicted in FIG. 2, device R1 is a resistive element. In some embodiments, device R1 is a resistor. In some embodiments, device R1 is a transistor or other suitable device configured to transfer at least a portion of DC voltage VBIAS from input node BIAS to internal node INT1.

Device M1 is a circuit component configured to selectively couple internal node INT1 to ground node GND, responsive to signal φCLK on signal node CLK.

In the first mode of operation, device M1 responds to a first logical state of signal φCLK by coupling internal node INT1 to ground node GND with a low-impedance path for both AC and DC components of voltage VIN. In the second mode of operation, device M1 responds to a second logical state of signal φCLK different from the first state by capacitively coupling internal node INT1 to ground node GND, thereby providing a high-resistance path for a DC component of voltage VIN.

In the embodiment depicted in FIG. 2, device M1 is an n-type metal oxide semiconductor (NMOS) transistor configured to operate in the first mode in response to signal φCLK having a high voltage value corresponding to the first logical state and to operate in the second mode in response to signal φCLK having a low voltage value corresponding to the second logical state. In some embodiments, device M1 is a p-type metal oxide semiconductor (PMOS) transistor or other suitable device configured to selectively operate in first and second modes in response to signal φCLK, as described above.

By the configuration of devices R1 and M1, DC voltage VBIAS is divided to generate a DC node voltage component of voltage VIN on internal node INT1. In the first mode of operation, because device M1 provides a low-resistance path between internal node INT1 and ground node GND, the DC node voltage component of voltage VIN has a value at or near a ground voltage level on ground node GND.

In the second mode of operation, because device M1 provides a high-resistance path between internal node INT1 and ground node GND, the DC node voltage has a value between a value of DC voltage VBIAS and the ground voltage level. The value of the DC node voltage component of voltage VIN is determined by the relative resistance values of devices R1 and M1 while operating in the second mode of operation.

By the configuration of devices C1 and M1, RF signal RFIN is divided to generate an RF component of voltage VIN on internal node INT1. In the first mode of operation, because device M1 provides a low-impedance path between internal node INT1 and ground node GND, the RF component of voltage VIN has a value at or near the ground voltage level on ground node GND.

In the second mode of operation, because device M1 capacitively couples internal node INT1 to ground node GND, devices C1 and M1 divide RF signal RFIN to generate an RF modulation signal as the AC component of voltage VIN. The RF modulation signal has a magnitude that is a fraction of the magnitude of RF signal RFIN. The ratio of the magnitude of the RF modulation signal to the magnitude of RF signal RFIN is determined by the relative capacitance values of devices C1 and M1 while operating in the second operating mode.

Devices C1, R1, and M1 are thereby configured to generate voltage VIN having DC and AC components at or near the ground voltage level in the first mode of operation, and to generate voltage VIN in the second mode of operation having a DC node voltage that is a fraction of DC voltage VBIAS and an RF modulation signal that is a fraction of RF signal RFIN.

The fractional value of the DC node voltage results from the voltage divider configuration of a resistance value RR1 of device R1 and a resistance value RM1 of the high-resistance path of device M1 while operating in the second mode of operation, and is therefore determined by the equation:

$$\text{DC node voltage value} = \text{VBIAS} \times RM1/(RM1+RR1). \quad (1)$$

The fractional value of the RF modulation signal results from the voltage divider configuration of a capacitance value CC1 of device C1 and a capacitance value CM1 of device M1 while operating in the second mode of operation, and is therefore determined by the equation:

$$\text{RF modulation signal value} = \text{RFIN} \times CC1/(CM1+CC1). \quad (2)$$

Device M2 is a circuit component configured to selectively transfer, or trace, voltage VIN from internal node INT1 to output node OUT. Device M2 is configured to receive a power supply voltage VDD on power node PWR and to selectively output current ID on output node OUT.

In the embodiment depicted in FIG. 2, device M2 is an NMOS transistor configured as a source follower. In some embodiments, device M2 is a PMOS transistor or other suitable device configured to selectively transfer voltage VIN from internal node INT1 to output node OUT and to selectively output current ID on output node OUT.

Device M3 is a circuit component configured to selectively couple output node OUT to ground node GND, responsive to signal φCLK on signal node CLK.

In the first mode of operation, device M3 responds to the first logical state of signal φCLK by coupling output node OUT to ground node GND with a low-impedance AC and DC path. In the second mode of operation, device M3 responds to the second logical state of signal φCLK by capacitively coupling output node OUT to ground node GND, thereby providing a high-resistance path for the DC node voltage component of voltage VRF on output node OUT. Device M3 is configured so that, in the second mode of operation, the capacitive coupling between output node OUT and ground node GND is asymmetrical such that the RF modulation signal component of voltage VRF is rectified.

In the embodiment depicted in FIG. 2, device M3 is an NMOS transistor configured to operate in the first mode in response to signal φCLK having a high voltage value corresponding to the first logical state and to operate in the second mode in response to signal φCLK having a low voltage value corresponding to the second logical state. In some embodiments, device M3 is a PMOS transistor or other suitable device configured to selectively operate in first and second modes in response to signal φCLK, as described above.

Device C2 is a circuit component configured to capacitively couple output node OUT to ground node GND. In the embodiment depicted in FIG. 2, device C2 is a capacitive element. In some embodiments, device C2 is a capacitor. In some embodiments, device C2 is a transistor or other suitable device configured to capacitively couple output node OUT to ground node GND.

In the first mode of operation, voltage VIN having DC and AC components at or near the ground voltage level, as described above, causes device M2 to be switched off and current ID to be at or near zero. Because device M3 is also configured to couple output node OUT to ground node GND with a low-impedance AC and DC path in the first mode of operation, voltage VRF is generated on output node OUT having a value at or near the ground voltage level.

In the second mode of operation, because device M2 is configured as a source follower and both of devices M3 and C2 are configured as high-resistance DC paths, the DC node voltage component of voltage VIN is transferred to output node OUT to generate a first DC component of voltage VRF.

In the second mode of operation, devices M3 and C2 act to rectify the RF modulation signal component of voltage VIN that is transferred from internal node INT1 to output node OUT. The RF modulation signal component of voltage VIN on internal node INT1 is therefore transferred to output node OUT as a second DC component of voltage VRF.

In the second mode of operation, because the RF modulation signal component of voltage VIN is generated by dividing RF signal RFIN, as described above, the magnitude of the second DC component of voltage VRF on output node OUT increases with respect to an increasing magnitude of RF signal RFIN, and decreases with respect to a decreasing magnitude of RF signal RFIN.

Power detection circuit 200 is configured to generate the DC component of voltage VIN by dividing DC voltage VBIAS; a sensitivity of a transfer function of power detection circuit 200 is therefore capable of being adjusted by adjusting the voltage level of DC voltage VBIAS. Because device M3 is switched on in the second mode of operation, power detection circuit 200 is configured to respond to DC voltage VBIAS having a voltage level that ranges from a threshold voltage of device M3 to power supply voltage VDD.

As described above, power detection circuit 200 is configured to generate voltage VRF having a first DC component based on DC voltage VBIAS and a second DC component based on the magnitude, or power level, of RF signal RFIN. Power detection circuit 200 is thereby capable of generating the first and second DC components of voltage VRF for detecting a power level of RF signal RFIN using less power than other approaches for detecting a power level of an RF signal.

Figure 3:
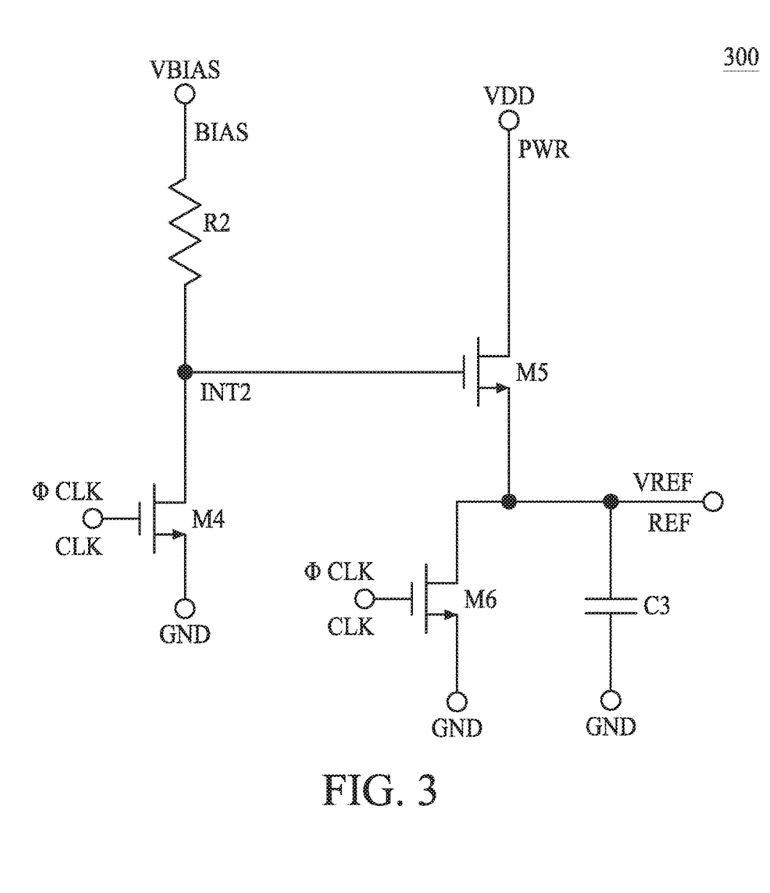
FIG. 3 is a diagram of a reference voltage circuit, in accordance with some embodiments.

FIG. 3 is a diagram of a reference voltage generator 300, in accordance with some embodiments. Reference voltage generator 300 is usable as reference voltage generator 130, described above with respect to transmitter circuit 100 and FIG. 1. Reference voltage generator 300 includes devices R2, M4, M5, M6, and C3. Reference voltage generator 300 also includes an output node REF. In some embodiments, output node REF is node 135 described above with respect to transmitter circuit 100 and FIG. 1.

Device R2 is coupled between input node BIAS and an internal node INT2. Device M4 is coupled between internal node INT2, signal node CLK, and ground node GND. Device M5 is coupled between internal node INT2, power node PWR, and output node REF. Device M6 is coupled between output node REF, signal node CLK, and ground node GND. Device C3 is coupled between output node REF and ground node GND.

Devices R2, M4, M5, M6, and C3 correspond to devices R1, M1, M2, M3, and C2, respectively, of power detection circuit 200, described above with respect to FIG. 2, and reference voltage generator 300 has a configuration that matches the configuration of power detection circuit 200, with the exception of a device that corresponds to device C1 of power detection circuit 200.

Accordingly, reference voltage generator 300 is configured to generate output voltage VREF on output node REF having a voltage level that includes the first DC component of voltage VRF but does not include the second DC component of voltage VRF, described above with respect to power detection circuit 200 and FIG. 2.

Similar to power detection circuit 200, reference voltage generator 300 is configured to switch between a first mode of operation and a second mode of operation responsive to signal φCLK on signal node CLK. During the first mode of operation, voltage generator 300 generates voltage VREF on output node REF having a value at or near the ground voltage level. During the second mode of operation, voltage generator 300 generates voltage VREF on output node REF having the value of the first DC component of voltage VRF.

Because both power detection circuit 200 and reference voltage generator 300 are configured to switch between first and second modes of operation responsive to the same signal φCLK, power detection circuit 200 and reference voltage generator 300, in operation, switch between first and second modes of operation synchronously.

In some embodiments, at least one of power detection circuit 200 or reference voltage generator 300 is configured to respond to signal φCLK being a clock signal. In some embodiments, at least one of power detection circuit 200 or reference voltage generator 300 is configured to respond to signal φCLK having a switching frequency of 100 Hertz (Hz) to 1000 Hz. In some embodiments, at least one of power detection circuit 200 or reference voltage generator 300 is configured to respond to signal φCLK having a switching frequency below 100 Hz. In some embodiments, at least one of power detection circuit 200 or reference voltage generator 300 is configured to respond to signal φCLK having a switching frequency above 1000 Hz.

Figure 4:
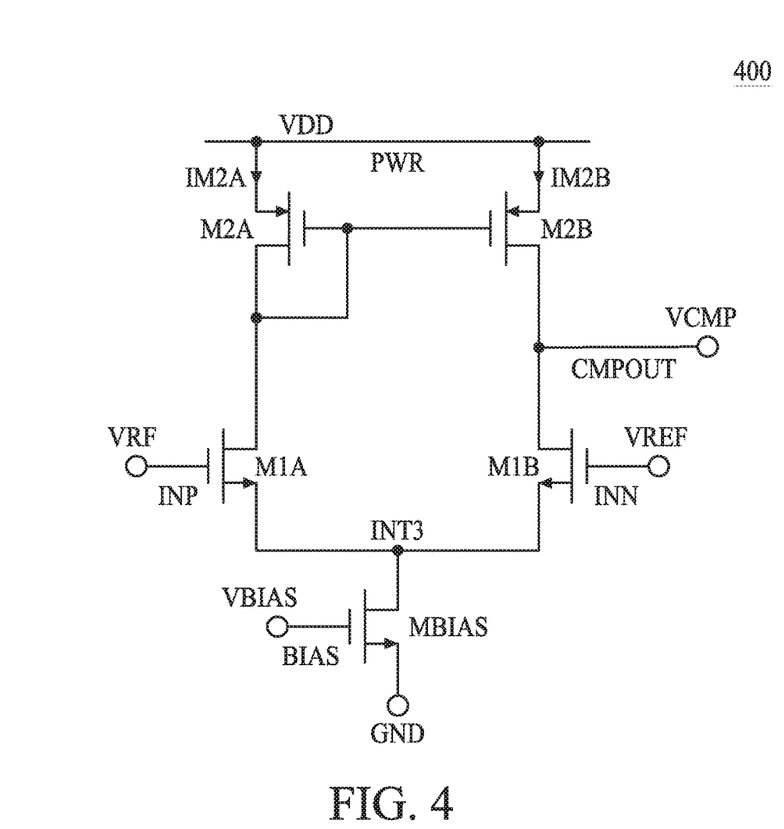
FIG. 4 is a diagram of a comparator circuit, in accordance with some embodiments.

FIG. 4 is a diagram of a comparator 400, in accordance with some embodiments. Comparator 400 is usable as comparator 140, described above with respect to transmitter circuit 100 and FIG. 1. Comparator 400 includes transistors M1A, M2A, M1B, and M2B coupled between power node PWR, carrying power supply voltage VDD, and a node INT3, and transistor MBIAS coupled between node INT3 and ground node GND, at the ground voltage level.

Comparator 400 also includes an input node INP, an input node INN, and an output node CMPOUT. In some embodiments, input node INP is node 125, input node INN is node 135, and output node CMPOUT is node 145, each described above with respect to transmitter circuit 100 and FIG. 1.

Transistors M2A and M2B are PMOS transistors having source terminals coupled to power node PWR and gate terminals coupled to each other and to a drain terminal of transistor M2A. Transistors M2A and M2B are thereby configured as a current mirror such that, in operation, a current IM2A flowing through transistor M2A has a same value as that of a current IM2B flowing through transistor M2B.

Transistor M1A is an NMOS transistor having a source terminal coupled to node INT3, a drain terminal coupled to the drain terminal of transistor M2A, and a gate terminal coupled to node INP carrying voltage VRF. Transistor M1A is thereby configured in series with transistor M2A such that, in operation, current IM2A flows through transistor M1A.

Transistor M1B is an NMOS transistor having a source terminal coupled to node INT3, a drain terminal coupled to the drain terminal of transistor M2B and node CMPOUT, and a gate terminal coupled to node INN carrying voltage VREF. Node CMPOUT is configured so that, in operation, current on node CMPOUT is not significant. Transistor M1B is thereby configured in series with transistor M2B such that, in operation, substantially all of current IM2B flows through transistor M1B.

Because current IM2A is mirrored to current IM2B, in operation, currents through transistors M1A and M1B are the same. In operation, voltage VRF at the gate terminal of transistor M1A, by controlling current flow through transistor M1A, also controls current flow through transistor M1B.

In operation, transistor M1B is controlled both by voltage VREF at the gate terminal of transistor M1B and by voltage VRF at the gate terminal of transistor M1A. By the configuration of transistors M1A and M1B, in operation, a voltage drop across the drain and source terminals of transistor M1B increases as voltage VRF increases relative to voltage VREF and decreases as voltage VRF decreases relative to voltage VREF. Thus, transistors M1A and M1B are referred to as a differential pair.

Transistor MBIAS is an NMOS transistor having a drain terminal coupled to node INT3, a source terminal coupled to ground node GND, and a gate terminal coupled to node BIAS carrying DC voltage VBIAS. In operation, a voltage on node INT3 relative to the ground voltage level is controlled by a value of DC voltage VBIAS at the gate terminal of transistor MBIAS.

Voltage VCMP on node CMPOUT is the sum of the voltage drop across transistor M1B and the voltage on node INT3. For a given value of DC voltage VBIAS, voltage VCMP is controlled by the differential values of voltages VRF and VREF. Comparator 400 is thereby configured as an amplifier such that, in operation, comparator 400 receives voltage VRF on node INP, receives voltage VREF on node INN, generates voltage VCMP based on voltage VREF subtracted from voltage VRF, and outputs voltage VCMP on output node CMPOUT.

Comparator 400 is configured to receive DC voltage VBIAS on node BIAS and to adjust a sensitivity of the differential pair of transistors M1A and M1B to voltages VRF and VREF. In operation, a sufficiently large value of DC voltage VBIAS, e.g., VDD, causes transistor MBIAS to be fully on such that the voltage on node INT3 is near the ground voltage level. As DC voltage VBIAS decreases in value, the voltage on node INT3 and the source terminals of transistors M1A and M1B increases. Because transistors M1A and M1B are controlled by voltages VRF and VREF as discussed above, increasing the voltage on node INT3 increases the sensitivity of transistors M1A and M1B to changes in the values of voltages VRF and VREF at the gate terminals of transistors M1A and M1B.

In addition to comparator 400, both power detection circuit 200 and reference voltage generator 300 are configured to receive DC voltage VBIAS, as discussed above. In some embodiments in which transmitter circuit 100 includes power detection circuit 200, reference voltage generator 300, and comparator 440, transmitter circuit 100 is thereby configured to, in operation, adjust an overall sensitivity to the power level of signal RFOUT.

Figure 5:
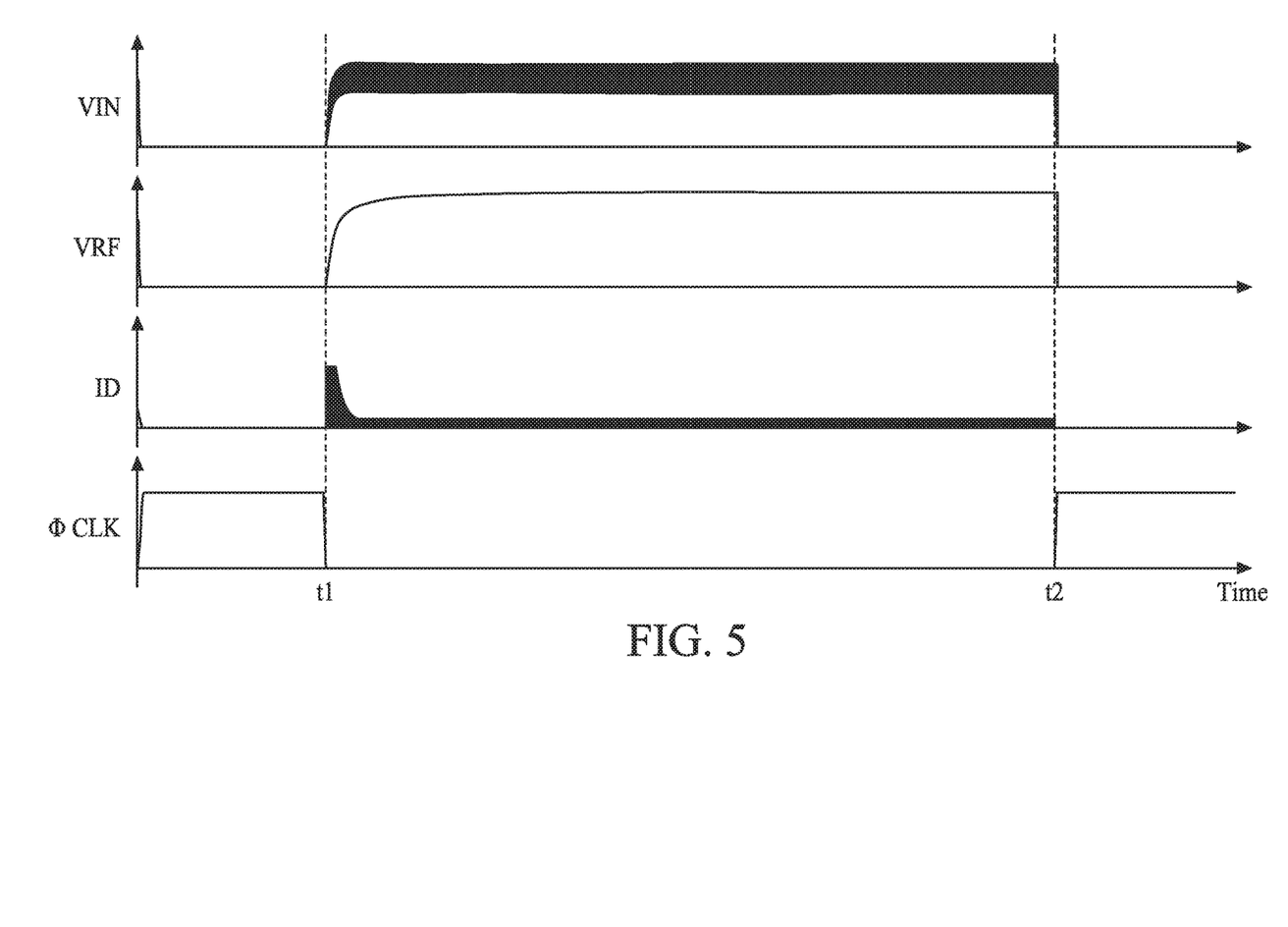
FIG. 5 is a timing diagram of voltage and current signals at various nodes of the power detection circuit of FIG. 2, in accordance with some embodiments.

FIG. 5 is a timing diagram of voltage and current signals at various nodes of power detection circuit 200, in accordance with some embodiments. FIG. 5 depicts voltages VIN and VRF, current ID, and signal φCLK, described above with respect to detection circuit 200 and FIG. 2.

At a time t1, signal φCLK switches from a high logical level to a low logical level, and, at a time t2, signal φCLK switches from the low logical level to the high logical level.

At time t1, voltage VIN rises asymptotically from a value at or near the ground voltage level to a second value that includes the RF modulation signal superimposed on the DC node voltage component of voltage VIN, as described above. At time t2, voltage VIN returns to the value at or near the ground voltage level.

At time t1, voltage VRF rises asymptotically from a value at or near the ground voltage level to a second value that includes the first DC component traced from the DC node voltage component of voltage VIN and the second DC component generated from the rectified RF modulation signal on node INT1, as described above. At time t2, voltage VRF returns to the value at or near the ground voltage level.

At time t1, current ID increases transiently as output node OUT is charged to the second value of voltage VRF, then decays to a value that essentially includes an RF component having an average at or near the ground voltage level.

Figure 6:
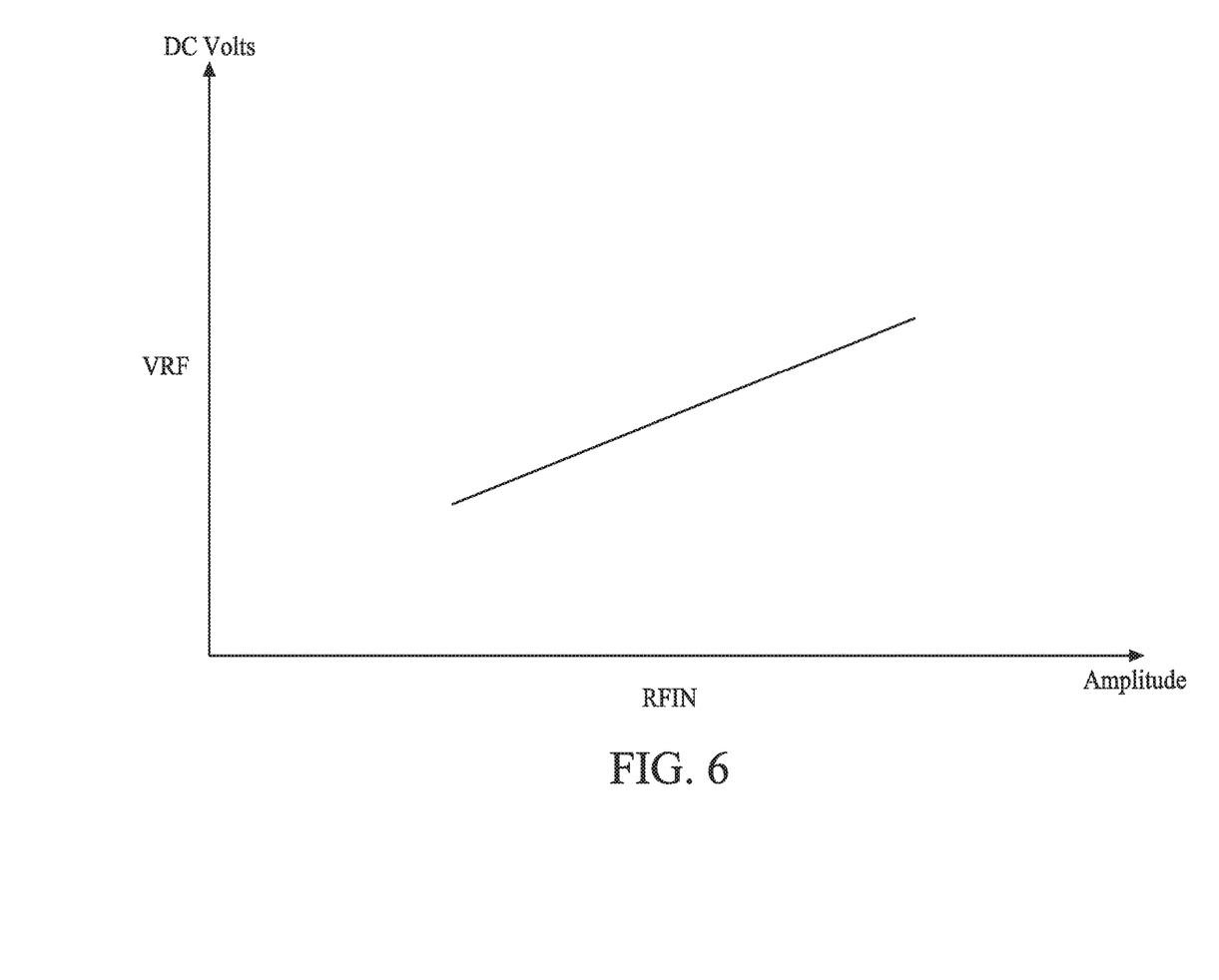
FIG. 6 is a diagram of a transfer function of the power detection circuit of FIG. 2, in accordance with some embodiments.

FIG. 6 is a diagram of a transfer function of power detection circuit 200, in accordance with some embodiments. FIG. 6 depicts voltage VRF as a function of the amplitude of RF signal RFIN, described above with respect to detection circuit 200 and FIG. 2. In the embodiment depicted in FIG. 6, voltage VRF increases linearly with respect to an increasing amplitude of RF signal RFIN.

Figure 7A:
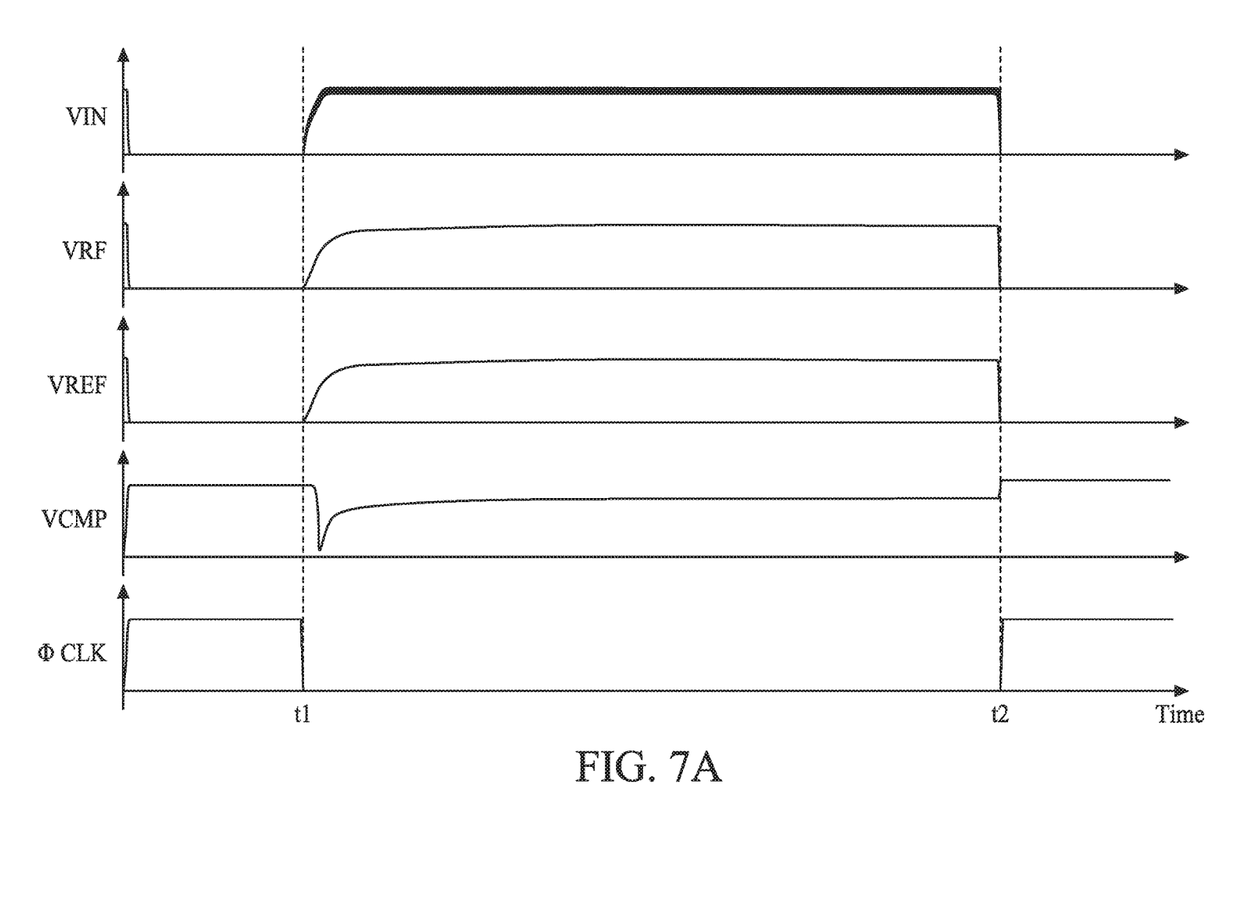
FIGS. 7A and 7B are timing diagrams of voltage signals at various nodes of the transmitter circuit of FIG. 1, in accordance with some embodiments.
Figure 7B:
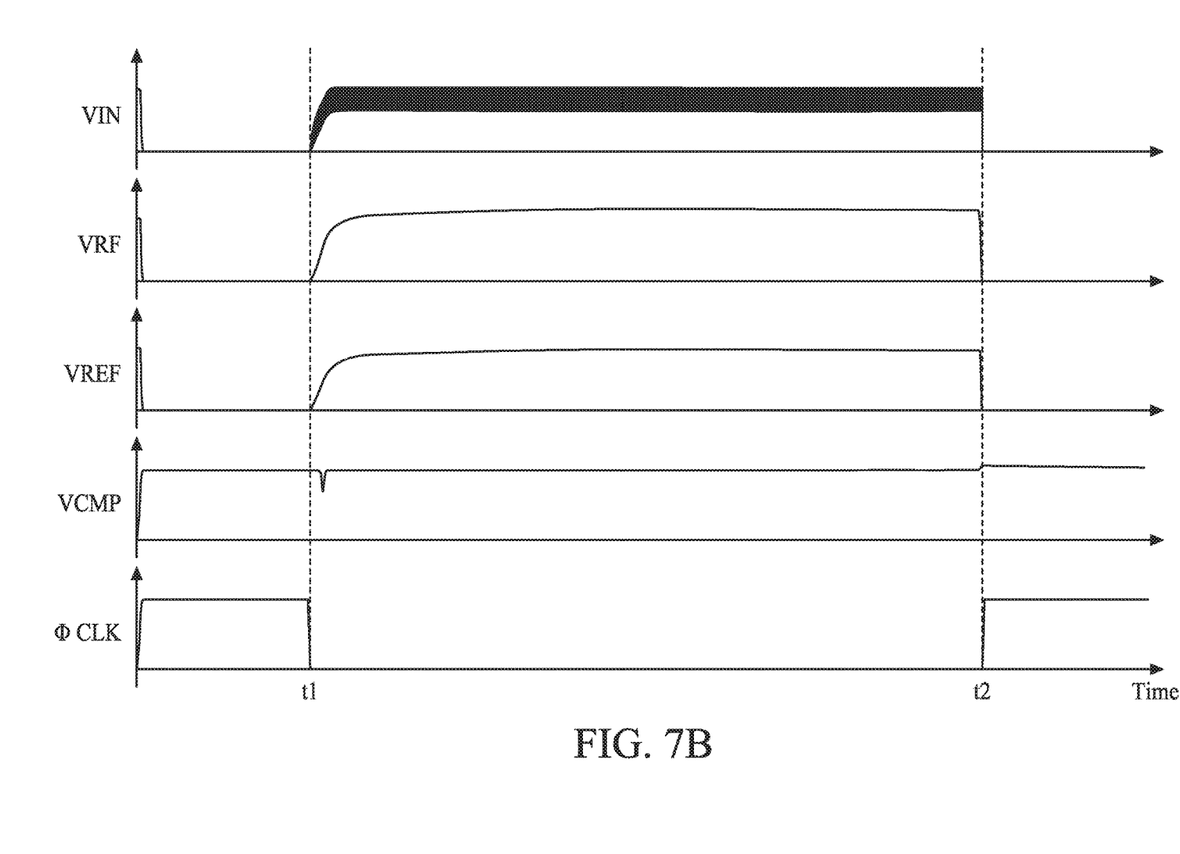

FIGS. 7A and 7B are timing diagrams of voltage signals at various nodes of transmitter circuit 100, in accordance with some embodiments. Each of FIGS. 7A and 7B depicts voltages VIN, VRF, VREF, and VCMP, and signal φCLK, described above with respect to transmitter circuit 100 and FIG. 1. FIG. 7A depicts a first case in which signal RFOUT has a first amplitude, and FIG. 7B depicts a second case in which signal RFOUT has a second amplitude larger than the first amplitude.

In both cases, between time t1, at which point signal φCLK switches from the high logical level to the low logical level, and time t2, at which point signal φCLK switches from the low logical level to the high logical level, each of signals VIN, VRF, and VREF rises asymptotically to a final value.

In response to the relative magnitudes of signal RFOUT, the RF component of voltage VIN depicted in FIG. 7A is smaller than the RF component of voltage VIN depicted in FIG. 7B. The DC value of voltage VRF is accordingly smaller in the first case depicted in FIG. 7A as compared to the second case depicted in FIG. 7B. Because voltage VREF is independent of the magnitude of signal RFOUT, voltage VREF is unchanged in the depictions of FIGS. 7A and 7B.

Because of the increase in value of voltage VRF in response to the increased amplitude of signal RFOUT, the value of voltage VCMP in the second case, depicted in FIG. 7B, is larger than the value of VCMP in the first case, depicted in FIG. 7A.

In operation, plurality of bits n generated by ADC 150 from voltage VCMP therefore represent the relative magnitude of signal RFOUT, and are used to make gain adjustments to amplifier 110 accordingly.

As described above with respect to power detection circuit 200 and FIG. 5, current ID has an average value at or near the ground reference value while outputting voltage VRF indicative of the power of signal RFOUT. As described above with respect to comparator 400 and FIGS. 7A and 7B, voltages VRF and VREF are received at high-impedance gate terminals of comparator 400 while outputting voltage VCMP indicative of the power of signal RFOUT.

By including power detection circuit 200, transmitter circuit 100 is capable of generating an indication of the amplitude of signal RFOUT while using current ID having a small value, thereby operating at a low power level. By including similarly configured reference voltage generator 300, transmitter circuit 100 is capable of generating a reference voltage while operating at a low power level. Transmitter circuit 100 is thereby configured to calibrate the power of output signal RFOUT using less power and DC current than are required in other RF signal calibration approaches. In some embodiments, transmitter circuit 100 is configured to calibrate signal RFOUT using a DC current that ranges from 50 microamperes (μA) to 100 μA.

In some embodiments, because power detection circuit 200 and reference voltage generator 300 are configured to operate in a first mode of operation in which voltages VRF and VREF are generated having values at or near the ground voltage level, power consumption averaged over the first and second modes of operation is further reduced in comparison to other approaches.

Figure 8:
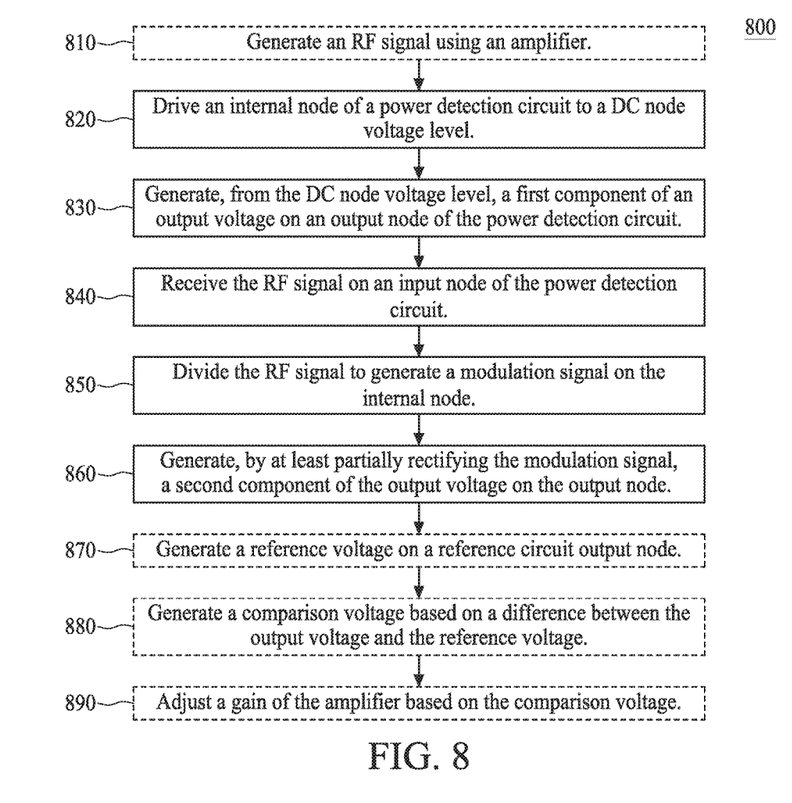
FIG. 8 is a flowchart of a method of detecting a power level of an RF signal, in accordance with some embodiments.

FIG. 8 is a flowchart of a method 800 of method of detecting a power level of an RF signal, in accordance with one or more embodiments. In some embodiments, method 800 is implemented to detect a power level of signal RFOUT of transmitter circuit 100, described above with respect to FIG. 1.

In some embodiments, operations in addition to those depicted in FIG. 8 are performed before, between, and/or after the operations depicted in FIG. 8. In some embodiments, the operations depicted in FIG. 8 are performed in an order other than the order depicted in FIG. 8.

At operation 810, in some embodiments, an RF signal is generated using an amplifier. The RF signal has an amplitude that corresponds to a power level of the RF signal. In some embodiments, generating the RF signal includes generating an RF signal using a power amplifier of an RF transmitter circuit. In some embodiments, generating the RF signal includes generating signal RFOUT using amplifier 110, described above with respect to transmitter circuit 100 and FIG. 1.

At operation 820, an internal node of a power detection circuit is driven to a DC node voltage level. In some embodiments, driving the internal node of a power detection circuit to a DC node voltage level includes dividing an input voltage with a voltage divider. In some embodiments, driving the internal node of a power detection circuit to a DC node voltage level includes driving the internal node of the power detection circuit responsive to a clock signal. In some embodiments, driving the internal node of a power detection circuit to a DC node voltage level includes driving internal node INT1 to the DC node voltage component of voltage VIN, described above with respect to power detection circuit 200 and FIG. 2.

At operation 830, from the DC node voltage level, a first component of an output voltage is generated on an output node of the power detection circuit. In some embodiments, generating the first component of the output voltage includes generating a first DC component of the output voltage. In some embodiments, generating the first component of the output voltage includes tracing the DC node voltage level using a source follower.

In some embodiments, generating the first component of the output voltage includes generating voltage VRF on node 125 using power detection circuit 120, described above with respect to transmitter circuit 100 and FIG. 1. In some embodiments, generating the first component of the output voltage includes generating the first DC component of voltage VRF on output node OUT, described above with respect to power detection circuit 200 and FIG. 2.

At operation 840, the RF signal is received on an input node of the power detection circuit. In some embodiments, receiving the RF signal includes receiving the RF signal with a capacitive element coupled to the input node of the power detection circuit. In some embodiments, receiving the RF signal includes receiving signal RFIN on input node IN, described above with respect to power detection circuit 200 and FIG. 2.

At operation 850, the RF signal is divided to generate a modulation signal on the internal node of the power detection circuit. In some embodiments, dividing the RF signal to generate the modulation signal includes dividing the RF signal responsive to a clock signal. In some embodiments, dividing the RF signal to generate the modulation signal includes dividing the RF signal using one or more devices used to generate the DC node voltage level. In some embodiments, dividing the RF signal to generate the modulation signal includes dividing RF signal RFIN to generate the RF modulation signal component of voltage VIN on internal node INT1, described above with respect to power detection circuit 200 and FIG. 2.

At operation 860, by at least partially rectifying the modulation signal, a second component of the output voltage is generated on the output node. In some embodiments, generating the second component of the output voltage includes generating a second DC component of the output voltage. In some embodiments, generating the second component of the output voltage includes generating the second component of the output voltage in response to a clock signal.

In some embodiments, generating the second component of the output voltage includes generating voltage VRF on node 125 using power detection circuit 120, described above with respect to transmitter circuit 100 and FIG. 1. In some embodiments, generating the second component of the output voltage includes generating the second DC component of output voltage VRF on output node OUT, described above with respect to power detection circuit 200 and FIG. 2.

At operation 870, in some embodiments, a reference voltage is generated on a reference circuit output node. In some embodiments, generating the reference voltage includes generating the reference voltage having a same value as a value of the first component of the output voltage.

In some embodiments, generating the reference voltage includes generating voltage VREF on node 135 using reference voltage generator 130, described above with respect to transmitter circuit 100 and FIG. 1. In some embodiments, generating the reference voltage includes generating voltage VREF on output node REF, described above with respect to reference voltage generator 300 and FIG. 3.

At operation 880, in some embodiments, a comparison voltage is generated based on a difference between the output voltage and the reference voltage. In some embodiments, generating the comparison voltage includes generating the comparison voltage equal to the difference between the output voltage and the reference voltage.

In some embodiments, generating the comparison voltage includes generating voltage VCMP on node 145 using comparator 140, described above with respect to transmitter circuit 100 and FIG. 1. In some embodiments, generating the comparison voltage includes generating voltage VCMP on output node CMPOUT, described above with respect to comparator 400 and FIG. 4.

At operation 890, in some embodiments, a gain of the amplifier is adjusted based on the comparison voltage. In some embodiments, adjusting the gain of the amplifier includes adjusting the amplifier to have a gain sufficient to output an RF signal having a predetermined power level. In some embodiments, adjusting the gain of the amplifier includes adjusting the gain of amplifier 110 to output signal RFOUT having a predetermined power level, described above with respect to transmitter circuit 100 and FIG. 1.

In some embodiments, adjusting the gain of the amplifier includes converting the comparison voltage to a digital signal. In some embodiments, adjusting the gain of the amplifier includes converting voltage VCMP to bits n on signal path 155 using ADC 150, described above with respect to transmitter circuit 100 and FIG. 1.

In some embodiments, adjusting the gain of the amplifier includes converting the comparison voltage to a digital signal by initiating a successive approximation sequence in an ADC. In some embodiments, adjusting the gain of the amplifier includes converting the comparison voltage to a digital signal during a second mode of operation, described above with respect to power detection circuit 200, reference voltage generator 300, and FIGS. 2 and 3.

By executing some or all of the operations of method 800, a power level of an RF signal is detected while obtaining the power and circuit size benefits described above with respect to transmitter circuit 100, power detection circuit 200, reference voltage generator 300, and comparator 400.

In some embodiments, a power detection circuit comprises a ground node, a first input node, a second input node, an internal node, an output node, a first device coupled between the first input node and the internal node, a second device coupled between the second input node and the internal node, a third device coupled between the internal node and the ground node, a fourth device coupled between the internal node and the output node, and a fifth device coupled between the output node and the ground node. The second device and the third device are configured to divide a DC bias voltage on the second input node to generate a DC node voltage on the internal node, the fourth device is configured to generate, from the DC node voltage, a first component of an output voltage on the output node, the first device and the third device are configured to divide an RF signal on the first input node to generate a modulation signal on the internal node, and the fifth device is configured to at least partially rectify the modulation signal to generate a second component of the output voltage on the output node.

In some embodiments, a transmitter circuit comprises an amplifier configured to output an RF signal on an output node, a power detection circuit coupled with the output node, a reference voltage generator, a comparator configured to receive an output voltage of the power detection circuit and a reference voltage of the reference voltage generator, and an ADC coupled between the comparator and the amplifier. The power detection circuit is configured to generate the output voltage having a first component based on a DC bias voltage and a second component based on a power level of the RF signal, the reference voltage generator is configured to generate the reference voltage based on the DC bias voltage, and the amplifier is configured to adjust the power level of the RF signal responsive to an output of the ADC.

In some embodiments, a method of detecting a power level of an RF signal comprises driving an internal node of a power detection circuit to a DC node voltage level, generating, based on the DC node voltage level, a first component of an output voltage on an output node of the power detection circuit, receiving the RF signal on an input node of the power detection circuit, dividing the RF signal to generate a modulation signal on the internal node, and generating, by at least partially rectifying the modulation signal, a second component of the output voltage on the power detection circuit output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A power detection circuit comprising:
 a ground node;
 a first input node;
 a second input node;
 an internal node;
 an output node;
 a first device coupled between the first input node and the internal node;
 a second device coupled between the second input node and the internal node;
 a third device coupled between the internal node and the ground node;
 a fourth device coupled between the internal node, a power node, and the output node; and
 a fifth device coupled between the output node and the ground node,
 wherein
  the second device and the third device are configured to divide a direct current (DC) bias voltage on the second input node to generate a DC node voltage on the internal node,
  the fourth device is configured to generate, based on the DC node voltage, a first component of an output voltage on the output node, the first device and the third device are configured to divide a radio frequency (RF) signal on the first input node to generate a modulation signal on the internal node, and the fifth device is configured to at least partially rectify the modulation signal to generate a second component of the output voltage on the output node.

2. The power detection circuit of claim 1, wherein the first device comprises a capacitive element.

3. The power detection circuit of claim 1, wherein the second device comprises a resistive element.

4. The power detection circuit of claim 1, wherein the third device comprises a transistor configured to selectively couple the internal node to the ground node responsive to an input signal at a gate terminal of the transistor.

5. The power detection circuit of claim 1, wherein the fourth device comprises a transistor configured as a source follower that traces the DC node voltage on the output node.

6. The power detection circuit of claim 1, wherein the fifth device comprises a transistor configured to selectively couple the output node to the ground node responsive to an input signal at a gate terminal of the transistor.

7. The power detection circuit of claim 1, further comprising a capacitor in parallel with the fifth device.

8. The power detection circuit of claim 1, wherein power detection circuit is configured so that the output voltage increases linearly with respect to an increasing amplitude of the RF signal.

9. A power detection circuit comprising:
a first capacitive element coupled between a first input node and an internal node, the first input node being configured to receive a radio frequency (RF) signal;
a resistive element coupled between a second input node and the internal node, the second input node being configured to receive a direct current (DC) bias voltage;
a first transistor coupled between the internal node and a ground node;
a second transistor coupled between the internal node and an output node; and
a third transistor coupled between the output node and the ground node,
wherein
the resistive element and the first transistor are configured as a voltage divider that generates a DC node voltage on the internal node based on the DC bias voltage,
the second transistor is configured as a source follower that generates a first component of an output voltage on the output node by tracing the DC node voltage,
the first capacitive element and the first transistor are configured as a voltage divider that generates a modulation signal on the internal node based on the RF signal, and
the third transistor is configured to at least partially rectify the modulation signal to generate a second component of the output voltage on the output node.

10. The power detection circuit of claim 9, wherein gate terminals of the first and third transistors are configured to receive a signal,
the first transistor is configured to, responsive to the signal, provide a low-impedance path between the internal node and the ground node for both alternating current (AC) and DC voltages in a first operating mode, and
the third transistor is configured to, responsive to the signal, provide a low-impedance path between the output node and the ground node for both AC and DC voltages in the first operating mode.

11. The power detection circuit of claim 10, wherein the second transistor is configured so that a current through the second transistor and the third transistor has a value at or near zero in the first operating mode.

12. The power detection circuit of claim 10, wherein
the first transistor is configured to, responsive to the signal, provide a high-resistance path between the internal node and the ground node for DC voltages in a second operating mode, and
the third transistor is configured to, responsive to the signal, provide a high-resistance path between the output node and the ground node for DC voltages in the second operating mode.

13. The power detection circuit of claim 12, wherein, in the second operating mode,
the first transistor is configured to capacitively couple the internal node to the ground node, and
the third transistor is configured to capacitively couple the output node to the ground node.

14. The power detection circuit of claim 13, further comprising a capacitive element configured to further capacitively couple the output node to the ground node in the second operating mode.

15. The power detection circuit of claim 12, wherein
in the first operating mode, each of the first component of the output voltage and the second component of the output voltage has a value at or near a ground voltage level of the ground node, and
in the second operating mode,
the first component of the output voltage has a first value based on a resistance value of the high-resistance path between the internal node and the ground node, and
the second component of the output voltage has a magnitude that increases with respect to an increasing amplitude of the RF signal.

16. The power detection circuit of claim 15, wherein a sensitivity of the magnitude of the second component of the output voltage increasing with respect to the increasing amplitude of the RF signal is responsive to a value of the DC bias voltage.

17. A power detection circuit comprising:
a capacitive element coupled between a first input node and an internal node, the capacitive element configured to generate a modulation signal on the internal node based on a radio frequency (RF) signal received on the first input node;
a resistive element coupled between a second input node and the internal node, the resistive element configured to generate a direct current (DC) node voltage on the internal node based on a DC bias voltage received on the second input node;
a source follower configured to trace the DC node voltage from the internal node to generate a first component of an output voltage on an output node; and
a first transistor configured to couple the output node to a ground node in a first operating mode responsive to a clock signal, and to at least partially rectify the modulation signal to generate a second component of the output voltage on the output node in a second operating mode responsive to the clock signal.

18. The power detection circuit of claim 17, further comprising a second transistor configured to couple the internal node to the ground node in the first operating mode responsive to the clock signal, and to combine with the resistive element to divide the DC bias voltage to generate the DC node voltage on the internal node in the second operating mode responsive to the clock signal.

19. The power detection circuit of claim 17, wherein a current from the source follower to the output node has a value at or near zero in the first operating mode.

20. The power detection circuit of claim 17, wherein the second component of the output voltage on the output node has a value that increases with respect to an increasing amplitude of the RF signal in the second operating mode.

* * * * *